United States Patent
Luo (10) Patent No.: US 11,101,311 B2
(45) Date of Patent: Aug. 24, 2021

(54) PHOTODETECTOR AND FABRICATION METHOD, AND IMAGING SENSOR

(71) Applicant: Ningbo Semiconductor International Corporation, Ningbo (CN)

(72) Inventor: Hailong Luo, Ningbo (CN)

(73) Assignee: Ningbo Semiconductor International Corporation, Ningbo (CN)

(*) Notice: Subject to any disclaimer, the term of this patent is extended or adjusted under 35 U.S.C. 154(b) by 59 days.

(21) Appl. No.: 16/229,721

(22) Filed: Dec. 21, 2018

(65) Prior Publication Data

US 2019/0393256 A1 Dec. 26, 2019

Related U.S. Application Data

(63) Continuation of application No. PCT/CN2018/112042, filed on Oct. 26, 2018.

(30) Foreign Application Priority Data

Jun. 22, 2018 (CN) .......................... 201810654716.1

(51) Int. Cl.
*H01L 27/14* (2006.01)
*H01L 27/146* (2006.01)
(Continued)

(52) U.S. Cl.
CPC .... *H01L 27/14634* (2013.01); *H01L 27/1462* (2013.01); *H01L 27/1463* (2013.01);
(Continued)

(58) Field of Classification Search
CPC ....... H01L 27/14634; H01L 31/022475; H01L 27/14636; H01L 27/1463; H01L 27/14645;
(Continued)

(56) References Cited

U.S. PATENT DOCUMENTS 5,187,369 A * 2/1993 Kingsley ........... H01L 27/14663
250/367
10,204,950 B1 * 2/2019 Yamashita .......... H01L 27/1464
(Continued)

FOREIGN PATENT DOCUMENTS

| CN | 101771063 A | 7/2010 |
| CN | 102569328 A | 7/2012 |
| CN | 103367380 A | 10/2013 |

*Primary Examiner* — Charles D Garber
*Assistant Examiner* — S M Sohel Imtiaz
(74) *Attorney, Agent, or Firm* — Anova Law Group, PLLC (57) ABSTRACT

Photodetectors and fabrication methods thereof and imaging sensors are provided. An exemplary photodetector includes a first substrate formed with pixel circuits and common electrode connection members and first wiring boards electrically connected to the corresponding pixel circuits; and a second substrate formed with pixel units and isolation wall members isolating pixel units. Each isolation wall member includes a conductive member and a sidewall; second wiring boards are formed on a front surface of the second substrate; the second wiring boards are electrically connected to first terminals of the pixel units; a transparent electrode layer is formed on a back surface of the second substrate; and a second terminal of each pixel unit is electrically connected to the transparent electrode layer. The second wiring boards are bonded and electrically connected to the first wiring boards and the transparent electrode layer is electrically connected to the common electrode connection members.

11 Claims, 4 Drawing Sheets

(51) Int. Cl.
*H01L 31/0224* (2006.01)
*H01L 31/18* (2006.01)

(52) U.S. Cl.
CPC .... *H01L 27/1469* (2013.01); *H01L 27/14636* (2013.01); *H01L 27/14645* (2013.01); *H01L 27/14649* (2013.01); *H01L 31/022475* (2013.01); *H01L 31/1884* (2013.01)

(58) Field of Classification Search
CPC ............. H01L 31/1884; H01L 27/1462; H01L 27/14649; H01L 27/1469
See application file for complete search history.

(56) References Cited

U.S. PATENT DOCUMENTS

| | | | |
|---|---|---|---|
| 2006/0285195 A1* | 12/2006 | Moriyama | G02B 26/026 359/296 |
| 2010/0079631 A1* | 4/2010 | Mitra | H01L 27/14694 348/294 |
| 2010/0167452 A1* | 7/2010 | Kim | H01L 27/1464 438/65 |
| 2011/0234505 A1* | 9/2011 | Kim | G06F 3/045 345/173 |
| 2012/0104535 A1* | 5/2012 | Kawakami | H01L 27/14694 257/453 |
| 2015/0076649 A1* | 3/2015 | Kim | H01L 27/14643 257/446 |
| 2015/0311241 A1* | 10/2015 | Park | H01L 27/14636 257/432 |
| 2016/0254310 A1* | 9/2016 | Yagi | H01L 23/481 257/435 |
| 2018/0240797 A1* | 8/2018 | Yokoyama | H01L 23/552 |

* cited by examiner

S10
Providing a first substrate formed with a plurality of pixel circuits and common electrode connection members, a first wiring board material layer is formed on a front surface of the first substrate, and the pixel circuits are electrically connected to the first wiring board material layer S11
Providing a second substrate formed with a plurality of pixel layers, a first wiring board material layer is formed on a front surface of the second substrate, and the pixel layers are electrically connected to the second wiring board material layer S12
Bonding the second wiring material layer with the first wiring material layer S13
Etching the second substrate, the second wiring board material layer the first wiring board material layer to form through holes and isolation wall member in the through holes, the through holes divide the pixel layers, the second wiring board material layer the first wiring board material layer to form a plurality of pixel units, a plurality of first wiring board and a plurality of second wiring boards, an isolation wall member includes a conducive member and a sidewall between the conductive member and the pixel unit S14
Forming a transparent material layer on a back surface of the second substrate, the transparent electrode layer covers the pixel units and the isolation wall members

PHOTODETECTOR AND FABRICATION METHOD, AND IMAGING SENSOR

CROSS-REFERENCES TO RELATED APPLICATIONS

This application is a continuation application of PCT patent application No. PCT/CN2018/112042, filed on Oct. 26, 2018, which claims priority to Chinese patent application No. 201810654716.1, filed on Jun. 22, 2018, the entirety of all of which is incorporated herein by reference.

FIELD OF THE DISCLOSURE

The present disclosure generally relates to the field of semiconductor manufacturing technology and, more particularly, relates to photodetectors and fabrication methods of photodetectors, and imaging sensors.

BACKGROUND

The photoelectric detection and imaging devices based on the photoelectric effect obtain detection signals or images by utilizing photoelectric signals. The photoelectric signals are generated by a semiconductor optoelectronic material when receiving an external radiation, and followed by signal amplifications and processing. The photoelectric detection and imaging devices are widely used in various fields of industry, automobile, and national economy. In the near-infrared region, the photoelectric detection and imaging devices are mainly used for radiation measurement and detection, industrial automatic control, and photometric measurement, etc. In the infrared wavelength region (850 nm to 12 μm wavelength), the photoelectric detection and imaging devices are mainly used for infrared imaging, infrared remote sensing, infrared radiation guidance, and other related fields.

Figure 1:
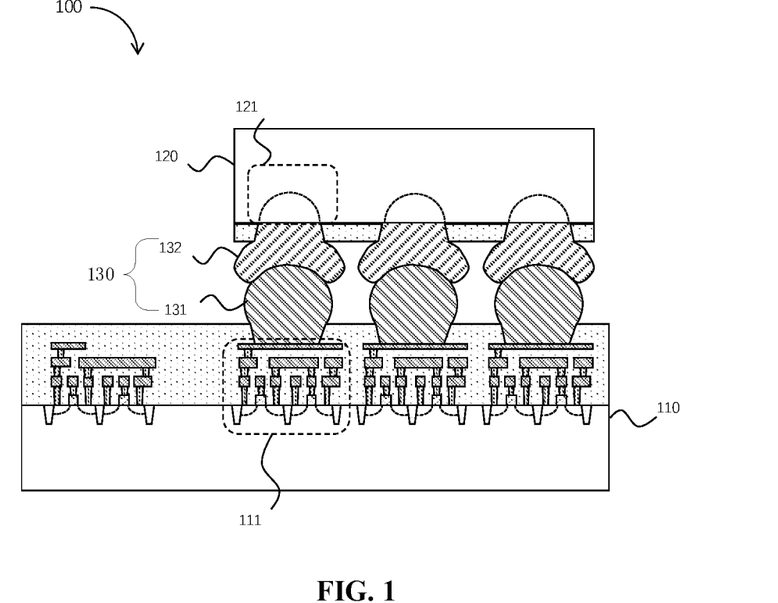
FIG. 1 illustrates a cross-sectional view of an existing photodetection and imaging device.

FIG. 1 illustrates an existing infrared photoelectric detection and imaging device. As shown in FIG. 1, the photoelectric detection and imaging device 100 includes a first substrate 110 having pixel circuits 111 generally compose of silicon-based CMOS devices, and a second substrate 120 having compound semiconductor-based photo-sensing pixel units 121. The first substrate 110 and the second substrate 120 are soldered together by micro soldering joints 130 (including first micro soldering joints 131 connected to the pixel circuits and second micro soldering joints 132 connected to the pixel units 121) to achieve an electrical connection between the pixel circuits 111 and the pixel units 121 to form a photoelectric detection and imaging device system integrated by a heterogeneous semiconductor microsystem.

The photoelectric detection and imaging device 100 is subject to the bottleneck of the soldering process of the micro soldering joints 130, and the size of the pixel units 121 is substantially large. In addition, because the difference between the micro soldering joints 130 on each of the pixel units 121 is reflected on the contact and on-resistance of the pixel units 121, it is easy to cause differences in the acquired signals among the pixel units 121 and the fixed pattern noise. At the same time, whenever the size of the pixel units 121 is reduced, the source signal interference among the pixel units caused by sensing photoelectron drift generated by the compound semiconductor-based photo-sensing pixel units 121 is also becoming more and more severe.

According to the current main stream SPWaP3 standard for photoelectric detection and imaging devices, the size, S, is a very important indicator. How to reduce the size of the photoelectric detection and imaging devices has been plagued by those skilled in the art.

BRIEF SUMMARY OF THE DISCLOSURE

One aspect of the present disclosure provides a photodetector. The photodetector may include a first substrate. The first substrate may contain a plurality of pixel circuits and common electrode connection members formed therein. A plurality of first wiring boards may be formed on a front surface of the first substrate, and the first wiring boards may be electrically connected to the pixel circuits. The photodetector may also include a second substrate. The second substrate may contain a plurality of pixel units and isolation wall members isolating the plurality of pixel units from each other formed therein. Each of the isolation wall members includes a conductive member and a sidewall disposed between the conductive member and the pixel unit. A plurality of second wiring boards may be formed on a front surface of the second substrate. The second wiring boards may be electrically connected to first terminals of corresponding pixel units. A transparent electrode layer may be formed on a back surface of the second substrate, and a second terminal of each of the plurality of pixel units may be electrically connected to the transparent electrode layer. The second wiring boards may be bonded with and electrically connected to the corresponding first wiring boards; and the transparent electrode layer may be electrically connected to the common electrode connection members through the conductive members.

Another aspect of the present disclosure provides a method for fabricating a photodetector. The method may include providing a first substrate. The first substrate may contain a plurality of pixel circuits and common electrode connection members formed therein. A first wring board material layer may be formed on a front surface of the first substrate, and the plurality of pixel circuits may be electrically connected to the first wiring board material layer. The method may also include providing a second substrate. The second substrate may contain a plurality of pixel layers formed therein. A second wiring board material layer may be formed on a front surface of the second substrate, and the pixel layers may be electrically connected to the second wiring board material layer. The method may also include bonding the second wiring board material layer with the first wiring board material layer; and etching the second substrate, the second wiring board material layer and the first wiring board material layer to form through holes and isolation wall members in the through holes. The through holes may divide the pixel layer, the second wiring board material layer, the first wiring board material layer into a plurality of pixel units, a plurality of second wiring boards and a plurality of first wiring boards. Each of the isolation wall member may include a conductive member and a sidewall between the conductive member and the pixel unit. Further, the method may include forming a transparent electrode layer on a back surface of the second substrate.

Another aspect of the present disclosure provides an imaging sensor. The imaging sensor may include a first substrate. The first substrate may contain a plurality of pixel circuits and common electrode connection members formed therein. A plurality of first wiring boards may be formed on a front surface of the first substrate, and the first wiring boards may be electrically connected to corresponding pixel circuits. The imaging sensor may also include a second substrate. The second substrate may contain a plurality of pixel circuits and isolation wall members isolating the pixel circuits formed therein. Each of isolation wall members may include a conductive member and a sidewall between the conductive member and a pixel unit. A plurality of second wiring boards may be formed on a front surface of the second substrate. The second wiring boards may be connected to first terminals of corresponding pixel units; a transparent electrode layer may be formed on a back surface of the second substrate; and a second terminal of each of the pixel unit may be connected to the transparent electrode. The second wiring boards may be bonded and electrically connected to first wiring boards; and the transparent electrode layer may be electrically connected to the common electrode connection members through the conductive members.

Other aspects of the present disclosure can be understood by those skilled in the art in light of the description, the claims, and the drawings of the present disclosure.

DETAILED DESCRIPTION

The photodetector, the fabrication method thereof and the imaging sensor of the present disclosure will be further described in detail below with reference to the accompanying drawings and specific embodiments. Advantages and features of the present disclosure will be apparent from the description and appended claims. It should be noted that the drawings are in a very simplified form and both use non-precise proportions, and are merely for convenience and clarity of the purpose of the embodiments of the present disclosure.

The present disclosure provides a photodetector and a fabrication method of a photodetector, and an imaging sensor, which solve the problem that the photoelectric detection and imaging device are limited by the micro soldering joint welding technology bottleneck and limited by difficulties in reducing the size of the pixel units.

Figure 3:
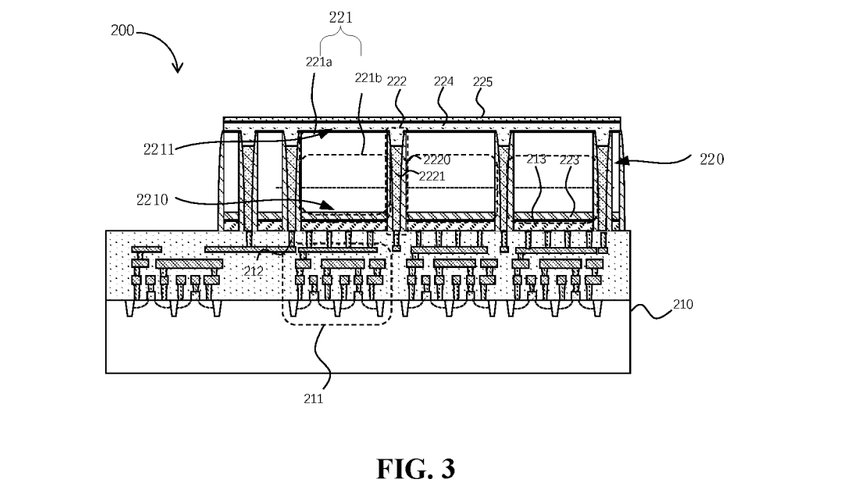
FIG. 3 is a portion of an A-A'-sectional view of the photodetector in FIG. 2.

FIG. 3 illustrates a cross-sectional view of an exemplary photodetector consistent with various disclosed embodiments. As shown in FIG. 3, in one embodiment, the photodetector 200 may include a first substrate 210. The first substrate 210 may contain a plurality of pixel circuits 211 and common electrode connection elements 212 formed therein. A plurality of first wiring boards 213 may be formed on a front surface of the first substrate 210. The first wiring boards 213 may be electrically connected to the corresponding pixel circuits 211. The photodetector 200 may also include a second substrate 220. The second substrate 220 may include a plurality of pixel units 221 and a plurality of isolation wall members 222 isolating the adjacent pixel units 221 formed therein. Each of the isolation wall members 222 may include a conductive member 2221 and a sidewall 2220 between the conductive member 2221 and the pixel unit 221. Further, a plurality of second wiring boards 223 may be formed on a front surface of the second substrate 220. Each of the second wiring boards 223 may be electrically connected to a first terminal 2210 of the corresponding pixel unit 221. A transparent electrode layer 224 may be formed on a second back surface of the second substrate 220. The second terminal 2221 of each pixel unit 221 may be electrically connected to the transparent electrode layer 224. A second wiring board 223 may be bonded with and electrically connected to a corresponding first wring board 213. The transparent electrode layer 224 may be connected to the common electrode connection members 212 through the conductive members 2221.

In one embodiment, the pixel units 221 and the pixel circuits 211 may be electrically connected by using the first wiring boards 213 and the second wiring boards 223, and the connection method may be a surface connection. Such a connection method may overcome the size limitation of the micro-soldering joint connection method. Thus, the size of the pixel units 221 may be substantially small. Further, the electrical connection between the pixel circuits 211 and the first wiring boards 213 may significantly reduce the contact resistance and on-resistance of each pixel unit 221 in the micro soldering joint connection method. Accordingly, the fixed mode noise may be reduced. In addition, in the photodetector 200, the pixel units 221 may be isolated by the isolation wall members 222, the alignment precision between the pixel units 221 and the pixel circuits 211 may be significantly improved from a process point of view. Each of the pixel units 221 may be electrically connected to the common electrode connection element 212 in the first substrate 210 through the transparent electrode layer 224. Thus, each of the pixel units 221 may be connected to a common potential through the same/substantially the same distance. Thus, the signal difference among the pixel units 221 may be reduced; and the stability and the quality of the photodetector 200 may be improved.

The first substrate 210 and the second substrate 220 may be made of any appropriate semiconductor material. In one embodiment, the second substrate 220 may be made of at least one of silicon, germanium, mercury cadmium telluride, cadmium zinc telluride, indium antimonide, gallium arsenide, indium phosphide, aluminum gallium arsenide, gallium arsenide and semiconductor alloy, etc.

In one embodiment, the photodetector 200 may be used to detect an electromagnetic wave having a wavelength between 850 nm and 12000 nm. When the photodetector 200 is used to detect an electromagnetic wave having a wavelength between 850 nm and 4000 nm, the material of the second substrate 220 may be selected from germanium or a germanium-containing alloy. When the photodetector 200 is used to detect an electromagnetic wave having a wavelength between 6000 nm and 12000 nm, the material of the second substrate 220 may be selected from a compound semiconductor, such as mercury cadmium telluride, or indium phosphide, etc. In some embodiments, the material of the second substrate may be selected according to the detection wavelength range, and the detection wavelength range may not be limited to the infrared region.

In one embodiment, the pixel unit 221 may be a red pixel, a green pixel, or a blue pixel in the three primary color pixels, or may be a white pixel in the four primary color pixels, and is not limited in this application. In particular, each of the pixel units 221 may include a pixel substrate 221a and a PN junction detector 221b formed in the pixel substrate 221a. The first terminal 2210 and the second terminal 2211 may be specifically disposed at two ends of the pixel substrate 221a. Further, the first terminal 2210 may also be one end of the PN junction detector 221b. The PN junction detector 221b may be formed by doping the pixel substrate 221a by any appropriate doping process, and is not limited in the present application. The PN junction detector 221b may also be formed by an epitaxial process.

Further, the line width of the lateral cross-section of a pixel unit 221 may be in a range of approximately 1 μm to 100 μm. For example, the line width of the lateral cross-section of the pixel unit 221 may be 2 μm, 5 μm, 10 μm, 20 μm, 30 μm, 50 μm, or 70 μm, etc. The line width of the vertical cross-section of the pixel unit 221 may be in a range of approximately 1 μm to 1000 μm. For example, the line width of the vertical cross-section of the pixel unit 221 may be 20 μm, 50 μm, 100 μm, 200 μm, 500 μm, or 700 μm. In one embodiment, the line width of the lateral cross-section of the pixel unit 221 may be limited only by the semiconductor process, and the semiconductor process may be able to achieve the nanometer level. Therefore, the line width of the lateral cross-section of the pixel unit 221 and the line width of the vertical cross-section of the pixel unit 221 may be set as needed.

The line width of the cross-section of an isolation wall member 222 may be in a range of 0.1 μm to 5 μm. For example, the line width of the cross-section of the isolation wall member 222 may be 0.2 μm, 0.5 μm, 1 μm, 1.5 μm, 2.5 μm, or 4 μm, etc. In one embodiment, the line width of the cross-section of the isolation wall member 222 may be matched with the line width of the cross-section of the pixel unit 221, and the line width of the cross-section of the isolation wall member 222 may be greater than 1/10 of the line width of the lateral cross-section of the pixel unit 221 to facilitate the realization of the process. In one embodiment, the line width of the cross-section of the isolation wall member 222 may be defined by the advanced etching process, which may be able to reach the sub-micron level. Thus, the pixel pitch may be greatly reduced, and it may facilitate to reduce the size of the pixel units 221.

Figure 2:
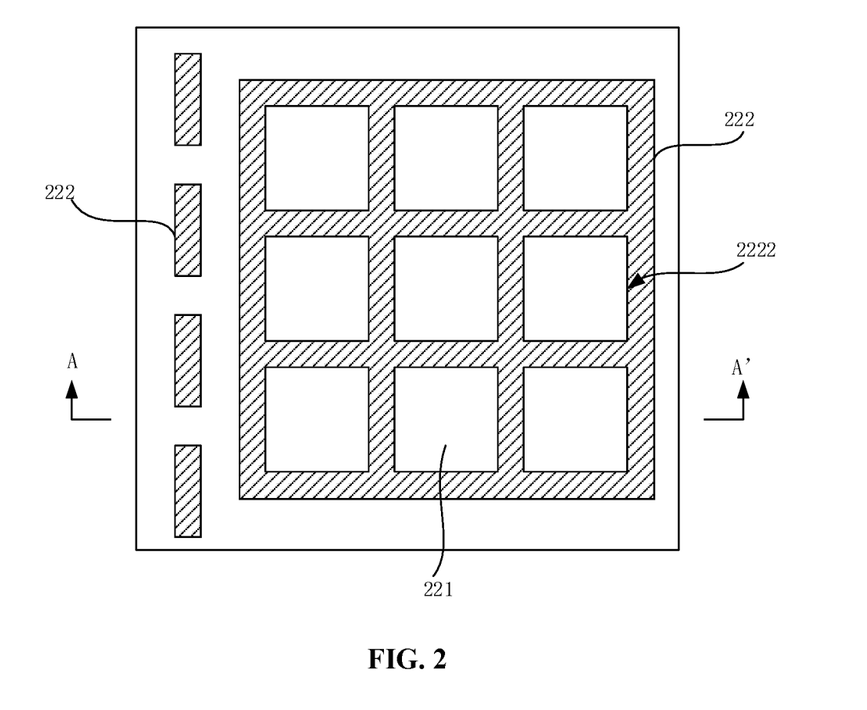
FIG. 2 illustrates a top view of a portion of an exemplary photodetector consistent with various disclosed embodiments.

Further, referring to FIG. 2 and FIG. 3, wherein FIG. 2 is a partial top view of the photodetector of one embodiment of the present disclosure, the pixel units 221 may be isolated from each other by the isolation wall members 222. In one embodiment, the isolation wall members 222 isolating the pixel units 221 may be connected together. Further, the isolation wall members 222 may have a rectangular shape in a peripheral area, and the isolation wall members 222 may divide the second substrate 220 of the peripheral area into a plurality of blocks to meet different needs, for example, to meet the needs of peripheral circuit connections.

In one embodiment, among the isolation wall members 222 surrounding one pixel unit 221 and along the circumferential direction, at least one segment of the conductive member 2221 of the isolation wall member 222 may be electrically connected to a common electrode connection member 212. The electrical connection may be a direct connection or indirect connection by using the conductive member 2221. In particular, the common electrode connection member 212 may include a plurality of discrete members, at least one discrete member may be disposed at one side of each of the pixel circuits 211. Each of the sidewall surfaces of each pixel unit 221 may be covered with the segment of the isolation wall member 222. The conductive member 2221 in the segment of the isolation wall member 222 covering the at least one sidewall surface of each pixel unit 221 may be electrically connected to one of the discrete members. Therefore, each of the pixel units 221 may be connected to a common potential through a same/substantially the same distance. Accordingly, the signal difference among the pixel units 221 may be reduced, and the stability and quality of the photodetector 200 may be improved.

Further, referring to FIG. 3, in one embodiment, the sidewall 2220 may cover the sidewall surfaces of the pixel unit 221 and extends from the second terminal 2211 of the pixel unit 221 to cover the sidewall surfaces of the first wiring board 213. In particular, each of the pixel units 221, each of the second wiring boards 223, and each of the first wiring boards 213 may be separated by the sidewalls 2220. Further, the conductive member 2221 may be disposed in the sidewall 2220. Thus, the conductive member 2221 and the pixel unit 221, the second wiring board 223, and the first wiring board 213 may also be separated by the sidewalls 2220.

The sidewalls 2220 may be made of at least one of an oxide semiconductor and a nitride semiconductor.

The sidewall 2220 may be a single-layer sidewall or a multiple-layer sidewall. A multi-layer sidewall may include a first sidewall and a second sidewall disposed inside the first sidewall. The first sidewall may cover the sidewall surface of the pixel unit 221 and may extend to cover the sidewall surface of the second wiring board 223. The second sidewall may cover the first sidewall and extends to cover the sidewall surfaces of the first wiring board 213. The pixel unit 221 may be protected from contaminations by the first sidewall, and the quality of the photodetector 200 may be improved.

In one embodiment, one end surface of the conductive member 2221 adjacent to the back surface of the second substrate 220 may be lower than the back surface of the second substrate 220. Further, at a side adjacent to the second terminal 2211 of the pixel unit 221, the surface of the conductive member 2221 may be lower than the surface of the sidewall 2220 (i.e., at the side adjacent to the second terminal 2211 of the pixel unit 221 and the conductive member 2221, the isolation wall member 222 may be recessed toward the first terminal 2210). The end face of the conductive member 2221 may be lower than the back surface of the second substrate 220, and the light irradiating on the conductive member 2221 may be prevented from being reflected to adjacent pixels to affect the image quality.

In one embodiment, the conductive member 2221 may be electrically connected to the common electrode connection member 212, and may also be electrically connected to the transparent electrode layer 224. The electrical connection between the transparent electrode layer 224 and the common electrode connection member 212 may be realized by using the conductive member 2221. The conductive member 2221 may be directly connected to the common electrode connection member 212 and the transparent electrode layer 224, or may be indirectly connected by using a conductive connection member. For example, other conductive members may be formed on the top end surface of the conductive member 2221 (i.e., the end surface adjacent to the transparent electrode layer 224), and the electrical connection between the conductive member 2221 and the transparent electrode layer 224 may be better realized. In some embodiments, other conductive members may be formed between the common electrode connection member 212 and the conductive member 2221 to achieve a better electrical connection therebetween.

Further, the conductive member 2221 may also be able to reduce the crosstalk among the pixel units 221, and improve the quality of the photodetector 200. The conductive member 2221 may be made of at least one of aluminum, copper, tungsten, titanium, cobalt, nickel, silver, gold, platinum, and an alloy of them. Specifically, the material of the conductive member 2221 may be selected from aluminum, copper, tungsten, titanium, cobalt, nickel, silver, gold, platinum, aluminum alloy, copper alloy, tungsten alloy, titanium alloy, cobalt alloy, nickel alloy, silver alloy, gold alloy, or a platinum alloy, etc. In one embodiment, the conductive member 2221 may be made of titanium nitride.

In one embodiment, the first wiring board 213 may include a first conductive layer, or the first wiring board 213 may include a first dielectric layer and a plurality of first soldering pads formed in the first dielectric layer. In particular, the first wiring board 213 may be a conductive structure as a whole, or may include a conductive portion and a non-conductive portion. The second wiring board 223 may include a second conductive layer, or the second wiring board 223 may include a second dielectric layer and a plurality of second soldering pads formed in the second dielectric layer. In particular, the second wiring board 223 may be entirely of a conductive structure, and may include a conductive portion and a non-conductive portion. One of the first wiring board 213 and the second wiring board 223 may be a conductive layer (that is, the whole structure is a conductive structure). During the process for bonding the first wiring board 213 with the second wiring board 223, the bonding alignment problem may be avoided. If the first wiring board 213 and the second wiring board 223 both include a dielectric layer and a plurality of soldiering pads, it may be necessary to pay attention to the bonding alignment such that the first wiring board 213 and the second wiring board 223 may realize electrical connections.

The first conductive layer may include at least one of a conductive paste, a conductive tape, and a metal layer. The second conductive layer may include at least one of a conductive paste, a conductive tape, and a metal layer.

In particular, at least one of the first wiring board 213 and the second wiring board 223 may be made of gold, silver, platinum, copper, aluminum, nickel, cobalt, or an alloy of any one of gold, silver, platinum, copper, aluminum. In some embodiments, at least one of the first wiring board 213 and the second wiring board 223 may be made of a conductive paste. For example, one of the first wiring board 213 and the second wiring board 223 is made of gold, and the other material may be selected from one of silver, platinum, copper, aluminum, nickel, cobalt, and an alloy of silver, platinum, copper, aluminum, nickel, and cobalt. Such materials may ensure a good bonding effect and may be able to control the bonding process so as to improve quality and reliability of the entire photodetector. In some embodiments, the material of the first wiring board 213 is selected from gold, and the material of the second wiring board 223 may be selected from silver, platinum, copper, aluminum, nickel, cobalt or an alloy thereof. Such a selection may ensure a good bonding effect, and may control the bonding process, and may also avoid process pollution.

In one embodiment, the second wiring board 223 may be bonded with the corresponding first wiring board 213; and the second wiring board 223 may be connected to the first terminal of the corresponding pixel unit 221. The bonding between the second wiring board 223 and the first wiring board 213 may be implemented by a wafer bonding process, or may be implemented by a conductive paste bonding process. Accordingly, an electrical connection between the pixel unit 221 and the pixel circuit 211 may be formed. When the wafer bonding process is used, a substantially low bonding temperature may be used; and the connection reliability between the second wiring board 223 and the first wiring board 213 may be ensured as well.

In one embodiment, the photodetector 200 may include a transparent enhancement and anti-reflection layer 225 covering the transparent electrode layer 224. The material of the transparent electrode layer 224 may be selected from indium tin oxide, or indium zinc oxide, etc. The transparent-enhancement and anti-reflection layer 225 may be made of magnesium fluoride, titanium oxide, lead sulfide, or lead selenide, etc.

Figure 4:
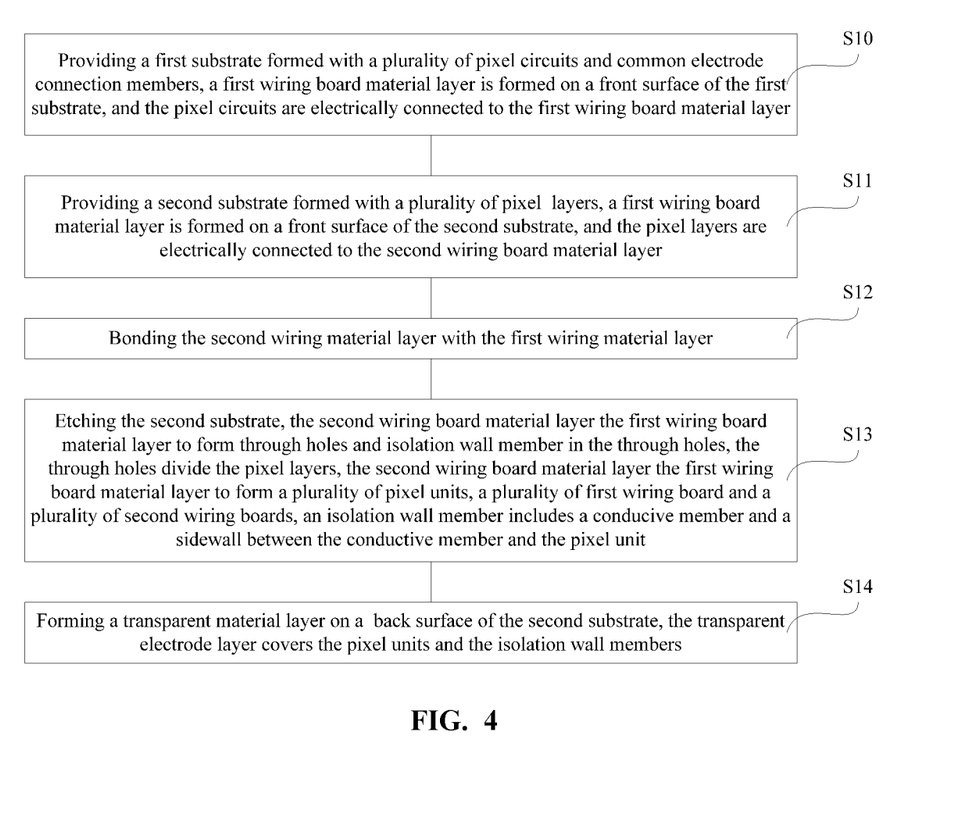
FIG. 4 illustrates a flow chart of an exemplary fabrication process of a photodetector consistent with various disclosed embodiments.

The present disclosure also provides a method for fabricating a photodetector. FIG. 4 illustrates a schematic flowchart of an exemplary method for fabricating a photodetector according to various embodiments of the present disclosure. As shown in FIG. 4, in one embodiment, the method for fabricating a photodetector may include following steps.

Step S10: a first substrate is provided. The first substrate may contain a plurality of pixel circuits and common electrode members formed therein. A first wiring board material layer may be formed on a front surface of the first substrate, and each of the pixel circuits may be electrically connected to the first wiring board material layer.

Step S11: a second substrate is provided. The second substrate may contain a pixel layer formed therein. A second wiring board material layer may be formed on a front surface of the second substrate, and the pixel layer may be electrically connected to the second wiring board material layer.

Step S12: the second wiring board material layer may be bonded with and electrically connected to the first wiring board material layer.

Step S13: the second substrate, the second wiring board material layer and the first wiring board material layer may be etched to form through holes and isolation wall members may be formed in the through holes. The through holes may divide the pixel layer, the second wiring board material layer and the first wiring board material layer to form a plurality of pixel units, a plurality of second wiring boards and a plurality of first wiring boards. Each of the isolation wall members may include a conductive member and a sidewall between the conductive member and the pixel unit Step S14: a transparent electrode layer may be formed on the back surface of the second substrate. The transparent electrode layer may cover the pixel units and the isolation wall members.

In one embodiment, Step S12, Step S13, and Step S14 may be sequentially performed, and Step S12, Step S13, and Step S14 may be performed after Step S10 and Step S11. Step S10 and Step S11 may be performed simultaneously. In some embodiments, Step S10 may be performed before Step S11. In other embodiments, Step S11 may be performed prior to Step S10. For illustrative purposes, that Step S10, Step S11, Step S12, Step S13, and Step S14 are sequentially performed is used as an example for the description.

Figure 5:
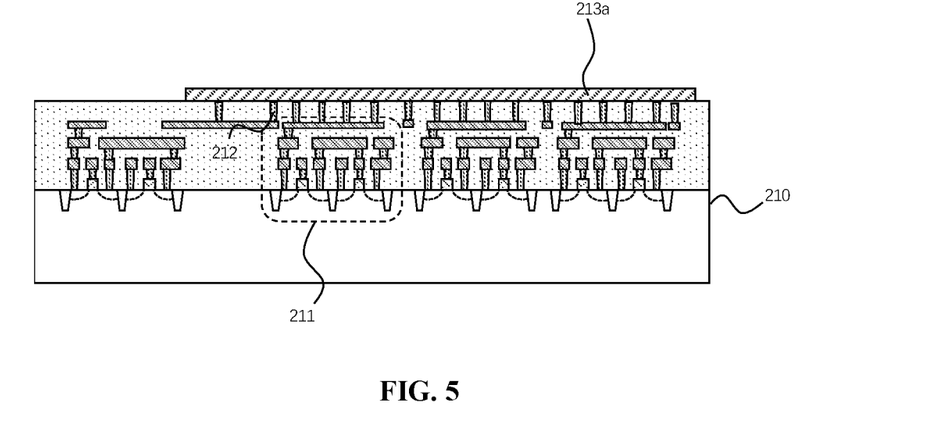
FIG. 5 illustrates a cross-sectional view of a portion of a first substrate of a photodetector consistent with various disclosed embodiment.

As shown FIG. 5, a first substrate 210 is provided. The first substrate may contain a plurality of pixel circuits 211 and common electrode connection members 212 formed therein. Further, a first wiring board material layer 213*a* may be formed on a front surface of the first substrate 210. Each of the pixel circuits 211 may be electrically connected to the first wiring board material layer 213a.

The first wiring board material layer 213a may be formed by a deposition process such as a physical vapor deposition (PVD) process, etc. The first wiring board material layer 213a may cover the entire surface of the first substrate 210. In some embodiments, the first wiring board material layer 213a may only cover the front surface of the bonding area of the first substrate 210 (i.e., the region where the first substrate 210 is bonded to the second substrate 220).

When the first wiring board material layer 213a covers the entire surface of the first substrate 210, during subsequently performing the Step S13, the portion of the first wiring board material layer 213a of the peripheral region (i.e., the non-bonding) of the front side of the first substrate 210 may be removed simultaneously, and the portion of the first wiring board material layer 213a covering the front surface of the bonding region of the first substrate 210 may be patterned to realize the division of the first wiring board material layer 213a to form a plurality of first wiring boards.

When the first wiring board material layer 213a covers only the front surface of the bonding region of the first substrate 210, the first wiring board material layer 213a covering the entire surface of the first substrate 210 may be formed first, and then the first wiring board material layer 213a covering the entire surface of the first substrate 210 may be patterned to remove the portion of the first wiring board material layer 213a covering the peripheral region (i.e., the non-bonding region) of the front surface of the first substrate 210. Thus, the first wiring board material layer 213a covering only the front surface of bonding region of the first substrate 210 may be formed.

The material of the first wiring board material layer 213a may be selected from one of gold, silver, platinum, copper, aluminum, nickel, cobalt or an alloy thereof (for example, a gold alloy, a silver alloy, a platinum alloy, a copper alloy, an aluminum alloy, a nickel alloy, or a cobalt alloy), or selected from a conductive paste. In one embodiment, the first wiring board material layer 213a may include a first conductive layer, or the first wiring board material layer 213a may include a first dielectric layer and a plurality of first conductive soldering pads on the first dielectric layer. The first conductive soldering pads may be electrically connected to the corresponding pixel circuits 211. In particular, the first wiring board material layer 213a may be an entire conductive layer structure, or may include a conductive structure only at a corresponding position of the pixel circuit 211, and may be electrically connected to the corresponding pixel circuit 211. The pixel circuits 211 may be formed by a semiconductor process. The pixel circuits 211 may have conventional functions, such as signal acquisition and amplification functions, etc. The common electrode connection member 212 may be a metal connector.

Figure 6:
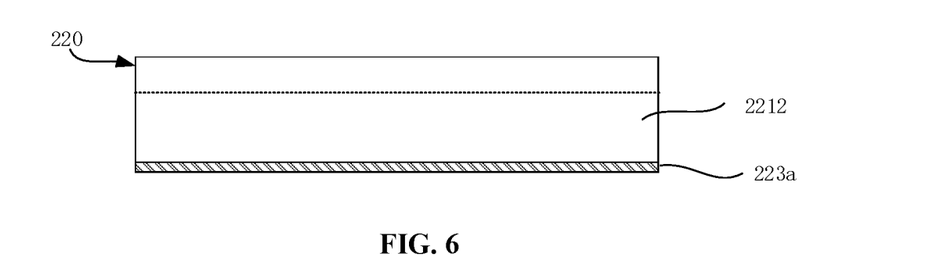
FIG. 6 illustrates a cross-sectional view of a portion of a second substrate of a photodetector consistent with various disclosed embodiment.

Further, as shown in FIG. 6, a second substrate 220 may be provided. A pixel layer 2212 may be formed in the second substrate 220. A second wiring board material layer 223a may be formed on a front surface of the second substrate 220. The pixel layer 2212 may be electrically connected to the second wiring board material layer 223a. The material of the second substrate 220 may be selected from at least one of silicon, germanium, mercury cadmium telluride, cadmium zinc telluride, indium antimonide, gallium arsenide, indium phosphide, aluminum gallium arsenide, gallium arsenide, or a semiconductor alloy, etc. The pixel layer 2212 may be formed by doping the second substrate 220. The material of the second wiring board material layer 223a may be selected from gold, silver, platinum, copper, aluminum, nickel, cobalt or an alloy thereof (for example, a gold alloy, a silver alloy, a platinum alloy, a copper alloy, an aluminum alloy, a nickel alloy or a cobalt alloy), or a conductive paste. The second wiring board material layer 223a may be formed by a deposition process, such as a physical vapor deposition (PVD) process, etc. In one embodiment, the second wiring board material layer 223a may include a second conductive layer, or the second wiring board material layer 223a may include a second dielectric layer and a plurality of second soldering pads on the second dielectric layer. The second soldering pads may be electrically connected to the pixel layer 2212. In particular, the second wiring board material layer 223a may be an entire conductive layer structure, or may include a conductive structure disposed only at a corresponding position where the pixel unit is to be formed, and may be electrically connected to the corresponding pixel unit.

Figure 7:
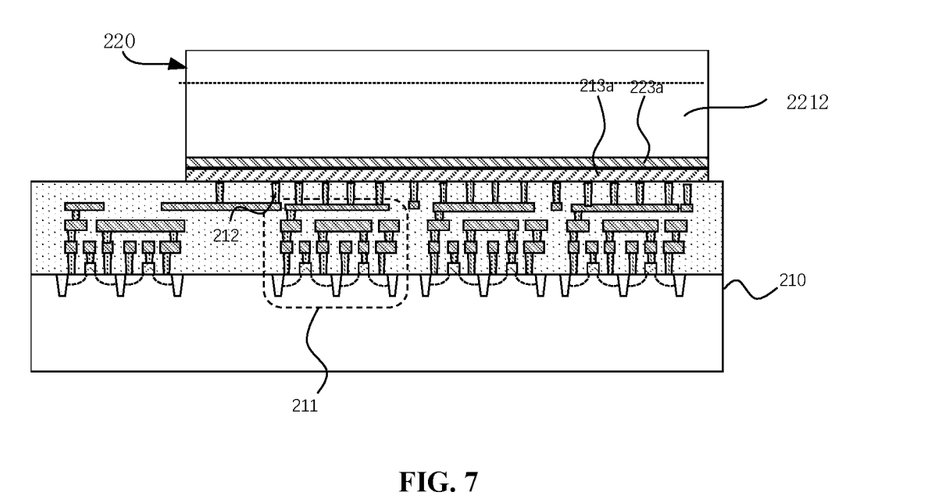
FIG. 7 illustrates a cross-sectional view of a portion of a structure formed by bonding a first wiring board material layer and a second wiring board material layer of a photodetector consistent with various disclosed embodiment.

Further, as shown in FIG. 7, the second wiring board material layer 223a may be bonded to the first wiring board material layer 213a. In particular, the second wiring board material layer 223a and the first wiring board material layer 213a may be bonded together and connected by a wafer bonding process or a conductive paste bonding process. For example, the second wiring board material layer 223a and the first wiring board material layer 213a may be bonded by a metal bonding process or a hybrid bonding process. According to the material of the second wiring board material layer 223a and the material of the first wiring board material layer 213a, different bonding temperatures may be used in the bonding process. In particular, the bonding process temperature may be in a range of approximately 100° C. to 500° C., which is not limited by the present application.

In one embodiment, the second wiring board material layer 223a is made of a material the same as the material of the first wiring board material layer 213a, for example, may be both made of copper. In such a case, the bonding temperature may be in range of approximately 250° C.-400° C. Optionally, before the bonding process, the second wiring board material layer 223a and the first wiring board material layer 213a may be subjected to a wet cleaning process and an in-situ gas protection process to remove the oxide layer (i.e., copper oxide layer) to improve the quality of the subsequent bonding process. In some embodiments, the material of the second wiring board material layer 223a and the material of the first wiring board material layer 213a may be both gold. In such a case, the bonding temperature may be in a range of approximately 250° C.-400° C. Optionally, before the bonding process, the second wiring board material layer 223a and the first wiring board material layer 213a may be irradiated with an oxygen plasma or an ultraviolet light for removing organics to improve the quality of the subsequent bonding process. In other embodiments, the material of the second wiring board material layer 223a and the material of the first wiring board material layer 213a may be both aluminum. In such a case, the bonding temperature may be in a range of approximately 400° C.-480° C. Optionally, before the bonding process, the second wiring board material layer 223a and the first wiring board material layer 213a may be subjected to an in-situ cleaning process using disassociated argon atoms to remove the oxide layer to improve the quality of the subsequent bonding process. In still other embodiments, the material of the second wiring board material layer 223a and the material of the first wiring board material layer 213a may be both titanium. In such a case, the bonding temperature may be in a range of approximately 300° C.-400° C. Optionally, before the bonding process, the second wiring board material layer 223a and the first wiring board material layer 213a may be subjected to a small type of cleaning process to remove organics to improve the quality of the subsequent bonding process.

Further, the material of the second wiring board material layer 223a and the material of the first wiring board material layer 213a may be different, for example, gold and indium, respectively. In such a case, the bonding temperature may be in a range of approximately 180° C.-210° C. Optionally, the second wiring board material layer 223a made of gold or the first wiring board material layer 213a made of gold may be subjected to an organic ashing treatment before the bonding process to improve the quality of the subsequent bonding process. In some embodiments, the material of the second wiring board material layer 223a and the material of the first wiring board material layer 213a may be respectively copper and tin, or copper tin silver and copper, respectively. In such a case, the bonding temperature may be in range of approximately 240° C.-270° C. Optionally, before the bonding process, the second wiring board material layer 223a made of copper or the first wiring board material layer 213a may be subjected to an oxide removal process to improve the quality of the subsequent bonding process. In other embodiments, the material of the second wiring board material layer 223a and the material of the first wiring board material layer 213a may be gold and tin, respectively. In such a case, the bonding temperature may be in a range of approximately 280° C.-310° C. Optionally, before the bonding process, the second wiring board material layer 223a made of gold or the first wiring board material layer 213a may be subjected to an organic ashing treatment to improve the quality of the subsequent bonding process. In still other embodiments, the material of the second wiring board material layer 223a and the material of the first wiring board material layer 213a may be gold and germanium respectively. In such a case, the bonding temperature may be in a range of approximately 380° C.-400° C. Optionally, before the bonding process, the second wiring board material layer 223a made of gold or the first wiring board material layer 213a may be subjected to an organic ashing treatment to improve the quality of the subsequent bonding process. In still other embodiments, the material of the second wiring board material layer 223a and the material of the first wiring board material layer 213a may be gold and silicon, respectively. In such a case, the bonding temperature may be in a range of approximately 390° C.-415° C. Optionally, before the bonding process, the second wiring board material layer 223a made of gold or the first wiring board material layer 213a may be subjected to an organic ashing treatment to improve the quality of the subsequent bonding process. In still other embodiments, the material of the second wiring board material layer 223a and the material of the first wiring board material layer 213a may be aluminum and germanium, respectively. In such a case, the bonding temperature may be in a range of approximately 430° C.-450° C., and the bonding process may be performed directly. In still other embodiments, the material of the second wiring board material layer 223a and the material of the first wiring board material layer 213a may be tin and lead, respectively. In such a case, the bonding process temperature may be in a range of approximately 180° C.-200° C., and the bonding process may be performed directly.

By selecting the material of the second wiring board material layer 223a and the material of the first wiring board material layer 213a, the temperature setting of the bonding process, and the different treatment processing before the bonding process, the reliability of the bonding between the second wiring board material layer 223a and the first wiring board material layer 213a may be ensured, and the influence on other devices may be avoided. Accordingly, the quality and the reliability of the photodetector may be improved.

Figure 8:
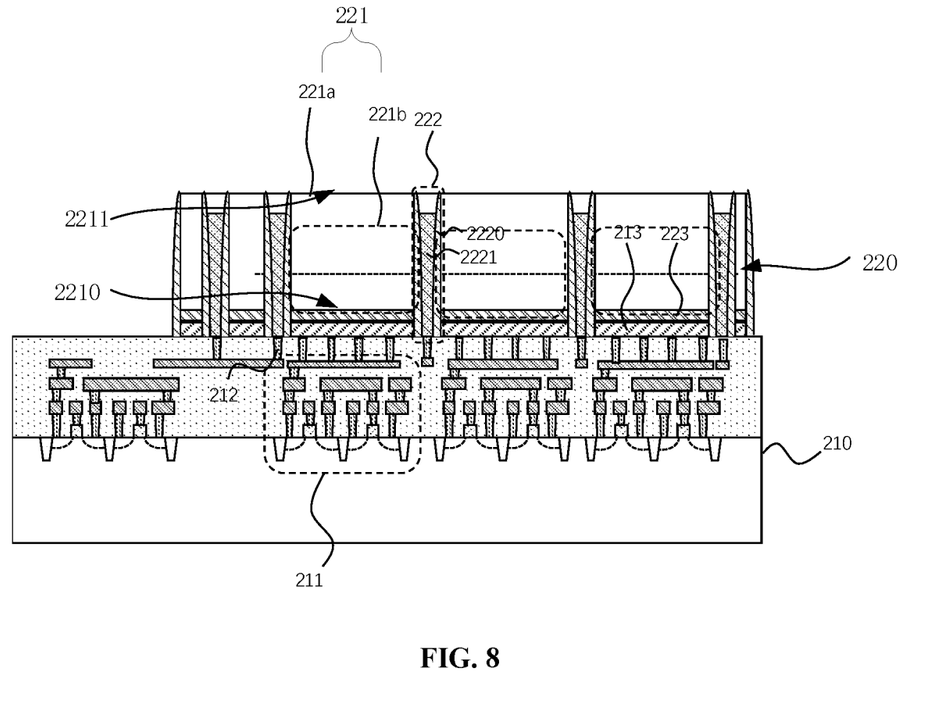
FIG. 8 illustrates a cross-sectional view of a structure after forming an isolation wall element consistent with various disclosed embodiment, where.

Further, as shown in FIG. 8, the second substrate 220, the second wiring board material layer 223a, and the first wiring board material layer 213a may be etched to form through holes and form an isolation wall member 222 in each of the through holes. The through holes may divide the pixel layer 2212, the second wiring board material layer 223a, and the first wiring board material layer 213a to form a plurality of pixel units 221, a plurality of second wiring boards 223, and a plurality of first wiring board 213. Each of the isolation wall members 222 may include a conductive member 2221 and a sidewall 2220 between the conductive member 2221 and the pixel unit 221.

In one embodiment of the present application, the through holes may be formed by a one-step etching process or a two-step etching process.

When the through holes are formed by a one-step etching process, the process for etching the second substrate 220, the second wiring board material layer 223a, and the first wiring board material layer 213a to form the through holes and forming the isolation wall members 222 in the through holes may include following steps.

First, the second substrate 220, the second wiring board material layer 223a, and the first wiring board material layer 213a may be etched to the front surface of the first substrate 210 to form the through holes. The through holes may divide the pixel layer 2212, the second wiring board material layer 223a, and the first wiring board material layer 213a to form the plurality of pixel units 221, the plurality of second wiring boards 223, and the plurality of first wiring boards 213.

Then, the sidewalls 2220 may be formed in the through holes. The sidewalls 2220 may cover the sidewall surfaces of the pixel units 221, the second wiring boards 223, and the first wiring boards 213. The sidewalls 2220 may be formed by depositing an oxide layer. The oxide layer may cover the sidewall surfaces and the bottoms of the through holes and extend to cover the back surface of the second substrate 220. In one embodiment, the thickness of the oxide layer may be in a range of approximately 1000 angstroms to 5000 angstroms. Then, the oxide layer covering the bottoms of the through holes and the oxide layer covering the back surface of the second substrate 220 may be removed (by an etching process) to form the sidewalls 2220.

Then, the conductive members 2221 may be filled in the through holes. In one embodiment, after filling the conductive members 2221 in the through holes, the conductive members 2221 may be further etched back so that the end surfaces of the conductive members 2221 adjacent to the back surface of the second substrate 220 may be lower than the back surface of the second substrate 220.

In particular, a metal layer (for example, a copper layer) may be formed by an electroplating process. The metal layer may fill the through holes and extend over the back surface of the second substrate 220. Then, a planarization process or a combination of a planarization process and an etching process may be used to remove the metal layer covering the back surface of the second substrate 220 and remove a partial thickness of the metal layer inside the through holes to form the conductive members 2221. In some embodiments, a metal nitride layer (TiN) may be formed as the conductive members 2221 in the through holes by an atomic layer deposition (ALD) process. The ALD process may not require a corresponding planarization process. After the ALD process, the etching process may be performed to remove the metal nitride layer covering the back surface of the second substrate 220, and then may be directly connected to the transparent electrode layer.

When the through holes are formed by a two-step etching process, the process for etching the second substrate 220, the second wiring board material layer 223a, and the first wiring board material layer 213a to form the through holes and form the isolation wall members 222 in the through holes may include following steps.

First, the second substrate 220 and the second wiring board material layer 223a may be etched to a surface of the first wiring board material layer 213a to form through holes. The through holes may divide the pixel layer 2212 and the second wiring board material layer 223a to form the plurality of pixel units 221 and the plurality of second wiring boards 223.

Then, a first sidewall layer (not shown) may be formed in each of the through holes. The first sidewall layer may cover the sidewall surfaces of the pixel unit 221 and the second wiring board 223. In particular, the first sidewall layer may be formed by depositing an oxide layer. The oxide layer may cover the sidewall surfaces and the bottom of the through hole and extend over the back surface of the second substrate 220. The thickness of the oxide layer may be in a range of approximately 100 angstroms to 3000 angstroms. Then, the oxide layer covering the bottom of the through hole and the oxide layer covering the back surface of the second substrate 220 may be removed (by an etching process) to form the first sidewall. The first sidewall may protect the pixel unit 221 from contaminations caused by etching the first wiring board material layer 213a.

Then, the first wiring board material layer 213a exposed in the through holes may be etched to the front surface of the first substrate 210 to deepen the through holes. The through holes may also divide the first wiring board material layer 213a to form the plurality of first wiring boards 213.

Then, a second sidewall layer may be formed the through hole. The second sidewall layer may cover the sidewall surfaces of the first sidewalls and the first wiring board 213. In particular, the second sidewall layer may be formed by depositing an oxide layer. The oxide layer may cover the sidewall surfaces and the bottom of the through holes and extend over the back surface of the second substrate 220. The thickness of the oxide layer may be in a range of approximately 100 angstroms to 3000 angstroms. Then, the oxide layer covering the bottoms of the through holes and the oxide layer covering the back surface of the second substrate 220 may be removed (by an etching process) to form the second sidewalls. The first sidewalls and the second sidewalls may form the sidewalls 2220.

Then, the conductive members 2221 may be filled in the through holes. In one embodiment, after filling the conductive members 2221 in the through holes, the conductive members 2221 may be further etched back such that the end surfaces of the conductive members 2221 adjacent to the back surface of the second substrate 220 may be lower than the back surface of the second substrate 220. In particular, a metal layer (for example, a copper layer) may be formed by an electroplating process. The metal layer may fill the through holes and extend over the back surface of the second substrate 220. Then, a planarization process or a combination of a planarization process and an etching process may be performed to remove the metal layer covering the back surface of the second substrate 220 and remove a partial thickness of the metal layer inside the through holes to form the conductive members 2221. In some embodiments, a metal nitride (TiN) layer may be formed in the through holes as the conductive members 2221 by an atomic layer deposition (ALD) process. The ALD process may not require a corresponding planarization process. After the ALD process, an etching process may be performed to remove the metal nitride layer covering the back surface of the second substrate 220; and then the conductive members may be directly connected to the transparent electrode layer.

In one embodiment, after forming the isolation wall members 222, as shown in FIG. 3, a transparent electrode layer 224 may be formed on the back surface of the second substrate 220. The transparent electrode layer 224 may be electrically connected to the common electrode connection members 212 by using the conductive members 2221. The transparent electrode layer 224 may be directly connected to the conductive members 2221, and the conductive members 2221 may be directly connected to the common electrode connection members 212. The material of the transparent electrode layer 224 may be selected from a transparent conductive material, for example, indium tin oxide, etc.

Further, an transparent-enhancement and anti-reflection layer 225 may be formed on the transparent electrode layer 224 to improve the reliability of the photodetector 200. The material of the transparent-enhancement and anti-reflection layer 225 may be selected from one of magnesium fluoride, titanium oxide, lead sulfide and lead selenide, etc.

In summary, in the present disclosed photodetector, the pixel units and the pixel circuits may be electrically connected by using the first wiring boards and the second wiring boards, and the connection manner may be a surface connection. Thus, the size limitation of the micro soldering joint connection manner may be overcome and the size of pixel units may be reduced. Further, the electrical connection between the pixel circuits and the first wiring boards, and the electrical connection between the pixel units and the second wiring boards may also significantly reduce the contact and on-resistance of each pixel unit in the micro soldering joint connection manner. Thus, the fixed mode noise may be reduced. In addition, in the photodetector of the present disclosure, the pixel units may be isolated by means of isolation wall members. The line width of the isolation wall members may be determined by the advanced etching process, and may reach the sub-micron level. Thus, the pixel pitch may be significantly reduced; and the size of pixel units may be reduced. From the process point of view, the alignment precision of the pixel units and the pixel circuits may be substantially improved. Each of the pixel units may be electrically connected to the common electrode connection member in the first substrate through the transparent electrode layer. Thus, each of the pixel units may be connected to a common potential through a same/substantially the same distance. Accordingly, the signal difference among the pixel units may be reduced, and the stability and quality of the photodetector may be improved.

Further, the end surfaces of the conductive members may be lower than the back surface of the second substrate, and the light irradiating on the conductive member may be prevented from reflecting to the adjacent pixels to affect the image quality.

In the fabrication method of the photodetector of the present disclosure, the electrical connections between the pixel units and the pixel circuits may be realized by bonding the first wiring board material layer with the second wiring board material layer. Because the thickness of the material layers may be substantially small and may not affect the bonding between the first wiring board material layer and the second wiring board material layer in the subsequent processes, the size of the pixel units may be significantly reduced. In addition, after the second substrate having the pixel layers is bonded with the first substrate having the pixel circuits, the isolation wall members may be formed to divide the pixel layers into pixel units. Thus, the alignment process may be eliminated; and the alignment accuracy may be significantly increased.

Further, the first wiring board material layer and the second wiring board material layer may be selected from metal, and may be connected by a bonding process. Thus, the fabrication process may be substantially simple.

Based on the principle of the above photodetector, the present disclosure also provides an imaging sensor.

The imaging sensor may include a first substrate. The first substrate may contain a plurality of pixel circuits and common electrode connection members formed therein. A plurality of first wiring boards may be formed on a front surface of the first substrate, and the first wiring boards may be electrically connected to the corresponding pixel circuits.

The imaging sensor may also include a second substrate. The second substrate may include a plurality of pixel units, and isolation wall members separating the pixel units from each other formed therein. Each of the isolation wall members may include a conductive member and a sidewall disposed between the conductive member and the pixel unit. A plurality of second wiring boards may be formed on a front surface of the second substrate. The second wiring board may be electrically connected to a first terminal of the corresponding pixel unit, and a transparent electrode layer may be formed on a back surface of the second substrate. The second terminal of each of the pixel units may be electrically connected to the transparent electrode layer.

The second wiring boards may be bonded with the corresponding first wiring boards and electrically connected to the first wiring boards. The transparent conductive layer may be electrically connected to the common electrode connection members by using the conductive members.

The imaging sensor and the photodetector may be modified according to the processed signal and the field of application, and the material of the pixel units and the circuits in the first substrate.

As disclosed, the technical solutions of the present disclosure may have the following advantages Comparing with conventional micro soldering joint connection method, in the photodetector of the present disclosure, the pixel units and the pixel circuits may be electrically connected by using the first wiring boards and the second wiring boards, and the connection manner may be a surface connection. Thus, the size limitation of the micro soldering joint connection method may be overcome; and the size of the pixel units may be reduced. Further, the electrical connections between the pixel circuits and the first wiring boards and the electrical connection between the pixel units and the second wiring boards may also significantly reduce the contact and on-resistance of each pixel unit in the micro soldering joint connection manner. Thus, the fixed mode noise may be significantly reduced. Further, in the photodetector of the present disclosure, the pixel units may be separated by the means of isolation wall members. Thus, from the fabrication process point of view, the alignment precision between the pixel units and the pixel circuits may be significantly improved. Each of the pixel units may be electrically connected to the common electrode connection member in the first substrate through the transparent electrode layer. Thus, each of the pixel units may be connected to a common potential through the same/substantially the same distance. Accordingly, the signal difference among the pixel units may be reduced; and the stability and quality of the photodetector may be improved.

Further, the end surfaces of the conductive members may be lower than the back surface of the second substrate, and the light irradiating on the conductive member may be prevented from being reflected to the adjacent pixels to affect the image quality.

In the fabrication method of the photodetector of the present disclosure, the electrical connections between the pixel units and the pixel circuits may be realized by bonding the first wiring board material layer and the second wiring board material layer. Because the thickness of the material layers may be substantially small and may not affect the bonding between the two material layers in the subsequent processes, the size of the pixel units may be significantly reduced. Further, after the second substrate having the pixel layers is bonded with the first substrate having the pixel circuits, the isolation wall members may be formed to divide pixel layers into pixel units. Thus, the alignment of the pixel units and the pixel circuits in the prior art may be eliminated. Accordingly, the alignment accuracy may be significantly increased.

Further, the first wiring board material layer and the second wiring board material layer may be made of metal and may be bonded by a wafer bonding process. Thus, the fabrication process may be substantially simplified.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A photodetector, comprising:
   a first substrate, containing a plurality of pixel circuits and common electrode connection members formed therein, wherein a plurality of first wiring boards are formed on a front surface of the first substrate, and the first wiring boards are electrically connected to corresponding pixel circuits; and
   a second substrate, containing a plurality of pixel units and isolation wall members isolating the plurality of pixel units from each other formed therein, wherein each of the isolation wall members includes a conductive member and a sidewall disposed between the conductive member and the pixel unit, a plurality of second wiring boards are formed on a front surface of the second substrate, the second wiring boards are electrically connected to first terminals of corresponding pixel units, a transparent electrode layer is formed on a back surface of the second substrate, and a second terminal of each of the plurality of pixel units is electrically connected to the transparent electrode layer,
   wherein the second wiring boards are bonded and electrically connected to the first wiring boards, and adjacent first wiring boards of the first substrate are separated by one of the isolation wall members of the second substrate.

2. The photodetector according to claim 1, wherein each of the first wiring boards comprises one of:
   a first conductive layer; and a first dielectric layer and a plurality of first soldering pads in the first dielectric layer.

3. The photodetector according to claim 1, wherein:
at least one of the first wiring board and the second wiring board is made of gold, silver, platinum, copper, aluminum, nickel, cobalt, an alloy of at least two of gold, silver, platinum, copper, aluminum, nickel, and cobalt, or a conductive paste.

4. The photodetector according to claim 1, wherein:
adjacent second wiring boards are separated by the one of the isolation wall members, and
the transparent electrode layer is formed on an entire surface of the back surface of the second substrate and is electrically connected to the common electrode connection members through corresponding conductive members in the isolation wall members.

5. The photodetector according to claim 1, wherein:
the second wiring boards are directly connected to first terminals of corresponding pixel units.

6. The photodetector according to claim 1, wherein:
compared with an end surface of the sidewall adjacent to the back surface of the second substrate, an end surface of the conductive member in each isolation wall member is recessed from the back surface of the second substrate, and
a portion of the transparent electrode layer is formed on the end surface of the conductive member within the isolation wall member.

7. The photodetector according to claim 1, wherein:
a line width of a lateral cross-section of an isolation wall member of the isolation wall members is in a range of approximately 0.1 μm-5 μm.

8. The photodetector according to claim 1, wherein:
the sidewall is made of at least one of a semiconductor oxide and a semiconductor nitride; and
the conductive member is made of one of aluminum, copper, tungsten, titanium, cobalt, nickel, silver, platinum, and an alloy of at least two of aluminum, copper, tungsten, titanium, cobalt, nickel, silver, and platinum.

9. The photodetector according to claim 1, wherein:
the first substrate is made of at least one of silicon, germanium, mercury cadmium telluride, cadmium zinc cadmium, indium antimonide, gallium arsenide, indium phosphide, aluminum gallium arsenide, gallium arsenide and a semiconductor alloy.

10. The photodetector according to claim 1, wherein a pixel unit of the plurality of pixel units comprises:
a pixel substrate; and
a PN junction detector.

11. An imaging sensor, comprising:
a first substrate, containing a plurality of pixel circuits and common electrode connection members formed therein, wherein a plurality of first wiring boards are formed on a front surface of the first substrate, and the first wiring boards are electrically connected to corresponding pixel circuits; and
a second substrate, containing a plurality of pixel circuits and isolation wall members isolating the pixel circuits formed therein, wherein each of the isolation wall members includes a conductive member and a sidewall between the conductive member and a pixel unit, a plurality of second wiring boards are formed on a front surface of the second substrate, the second wiring boards are electrically connected to first terminals of corresponding pixel units, a transparent electrode layer is formed on a back surface of the second substrate; and a second terminal of each pixel unit is connected to the transparent electrode layer,
wherein the second wiring boards are bonded and electrically connected to the first wiring boards, and adjacent first wiring boards of the first are separated by one of the isolation wall members of the second substrate.

* * * * *